(12) United States Patent
Nagashima

(10) Patent No.: US 9,685,236 B2
(45) Date of Patent: Jun. 20, 2017

(54) MEMORY CHIP, MEMORY DEVICE, AND READING METHOD

(71) Applicant: KABUSHIKI KAISHA TOSHIBA, Tokyo (JP)

(72) Inventor: Hiroyuki Nagashima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/398,955

(22) Filed: Jan. 5, 2017

(65) Prior Publication Data

US 2017/0117050 A1    Apr. 27, 2017

Related U.S. Application Data

(63) Continuation of application No. 14/195,770, filed on Mar. 3, 2014, now Pat. No. 9,543,027.

(30) Foreign Application Priority Data

Sep. 13, 2013  (JP) .................................. 2013-190566

(51) Int. Cl.
*G11C 16/28*  (2006.01)
*G11C 16/26*  (2006.01)
*G11C 29/04*  (2006.01)

(52) U.S. Cl.
CPC ...... *G11C 16/26* (2013.01); *G11C 2029/0411* (2013.01)

(58) Field of Classification Search
CPC ...... G11C 16/28; G11C 16/26; G11C 11/5642
USPC ............... 365/185.21, 196, 205, 207, 185.03
See application file for complete search history.

(56) References Cited

U.S. PATENT DOCUMENTS

| 7,954,037 B2 | 5/2011 | Lasser et al. |
| 2012/0216098 A1 | 8/2012 | Moro |
| 2012/0268994 A1 | 10/2012 | Nagashima |

(Continued)

FOREIGN PATENT DOCUMENTS

| JP | 2005267821 A | 9/2005 |
| JP | 2008097736 A | 4/2008 |
| JP | 2011100519 A | 5/2011 |

(Continued)

OTHER PUBLICATIONS

Japanese Office Action dated Feb. 9, 2016, filed in Japanese counterpart Application No. 2013-190566, 21 pages (with translation).

*Primary Examiner* — Jason Lappas
(74) *Attorney, Agent, or Firm* — Patterson & Sheridan, LLP

(57) ABSTRACT

A memory chip includes a memory cell array having a plurality of memory cells connected to word lines and bit lines, and a sense amplifier configured to detect data stored in a memory cell that is connected to a selected one of the word lines and a selected one of the bit lines, and a control circuit configured to read data from the memory cell in a first read mode when a first command is received and in a second read mode when a second command is received. A peak or an average value of an operation current that is flowing between power supply and ground terminals of the memory chip during a read operation in the first read mode is less than a peak or an average value of the operation current during a read operation in the second read mode.

14 Claims, 15 Drawing Sheets

(56) References Cited

U.S. PATENT DOCUMENTS

2012/0320672 A1* 12/2012 Meir .................. G11C 7/06
  365/185.03

FOREIGN PATENT DOCUMENTS

| JP | 2012173933 A | 9/2012 |
| JP | 2012-198949 A | 10/2012 |

* cited by examiner

MEMORY CHIP, MEMORY DEVICE, AND READING METHOD

CROSS-REFERENCE TO RELATED APPLICATION

This application is a continuation of U.S. patent application Ser. No. 14/195,770, filed on Mar. 3, 2014, which is based upon and claims the benefit of priority from Japanese Patent Application No. 2013-190566, filed Sep. 13, 2013, the entire contents of each of which are incorporated herein by reference.

FIELD

Embodiments described herein relate generally to a memory chip, a memory device, and a reading method.

BACKGROUND

One of known semiconductor memory devices is a NAND flash memory (hereinafter, referred to as a NAND memory) in which a plurality of memory cells are connected in series to each other to form a block. The NAND memory has drawn attention as a non-volatile semiconductor memory device capable of achieving high integration and high capacity.

In the NAND memory, data is written and read in the unit of a predetermined amount of data which is called a page. In the NAND memory, when data is read, a sense amplifier fixes data stored in the memory cell for each page, and the data is stored in a data register, read from the data register and is then transmitted to the outside.

DETAILED DESCRIPTION

In the NAND memory, the memory cells are connected in series to each other. Therefore, during a read operation, when the number of cells connected to a bit line increases, a cell current is reduced and the time required for the sense amplifier to detect the potential of the bit line increases, which results in an increase in read time. In addition, with the miniaturization of the memory device, the time required to apply a voltage to a word line (WL) increases and the setup time increases. Therefore, the read time increases.

In general, according to one embodiment, a memory chip includes a memory cell array having a plurality of memory cells connected to word lines and bit lines, and a sense amplifier configured to detect data stored in a memory cell that is connected to a selected one of the word lines and a selected one of the bit lines, and a control circuit configured to read data from the memory cell in a first read mode when a first command is received and in a second read mode when a second command is received. A peak or an average value of an operation current that is flowing between power supply and ground terminals of the memory chip during a read operation in the first read mode is less than a peak or an average value of the operation current during a read operation in the second read mode.

Hereinafter, a memory chip, a memory device, and a reading method according to embodiments will be described in detail with reference to the accompanying drawings. These embodiments are not intended to be limited.

First Embodiment

Figure 1:
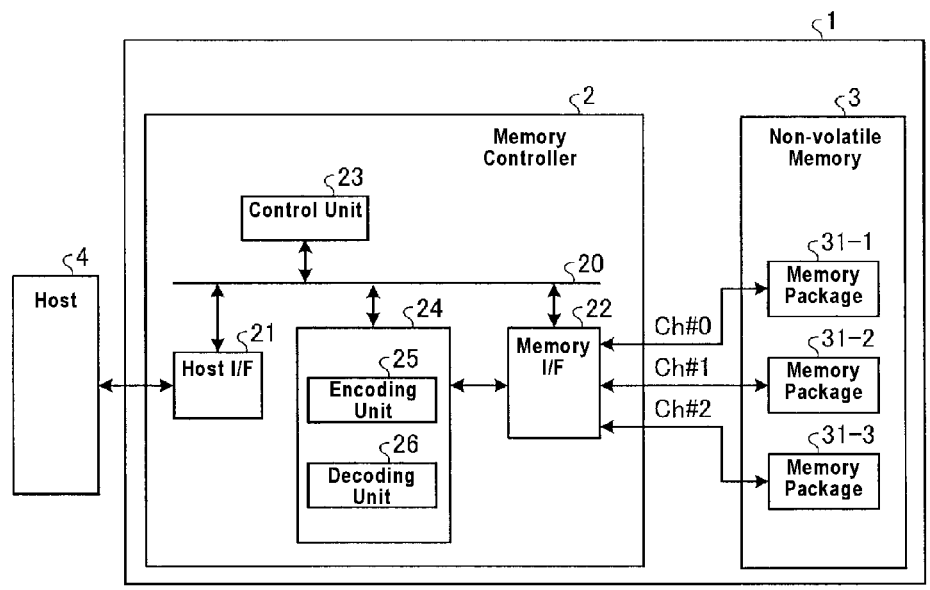
FIG. 1 is a diagram illustrating an example of a structure of a semiconductor memory device according to a first embodiment.

FIG. 1 is a diagram illustrating an example structure of a semiconductor memory device (memory device) according to a first embodiment. A semiconductor memory device 1 according to this embodiment includes a memory controller 2 and a semiconductor memory unit (non-volatile memory) 3. The semiconductor memory device 1 can be connected to a host 4. FIG. 1 shows a state in which the semiconductor memory device 1 is connected to the host 4. The host 4 is an electronic apparatus such as a personal computer or a portable terminal.

The semiconductor memory unit 3 is a NAND memory which stores data in a non-volatile manner. The semiconductor memory unit 3 includes a plurality of (in this embodiment, three) memory packages 31-1 to 31-3, the access to which is controlled in parallel. The memory packages 31-1 to 31-3 are independently connected to the memory controller 2 through signal line groups (channels ch#0 to ch#2). In this embodiment, the semiconductor memory unit 3 includes three memory packages. However, the number of memory packages in the semiconductor memory unit 3 is not limited to three, but the semiconductor memory unit 3 may include one or more memory packages.

In this embodiment, the semiconductor memory unit 3 includes two types of read modes, that is, a normal read mode (first read mode) and a fast read mode (second read mode). In the fast read mode, the read time is shorter than that in the normal read mode, as will be described in detail below.

The memory controller 2 controls the writing of data to the semiconductor memory unit 3 in response to a write command (request) from the host 4 and controls the reading of data from the semiconductor memory unit 3 in response to a read command (request) from the host 4. The memory controller 2 includes a host I/F 21, a memory interface (memory I/F) 22, a control unit 23, and an encoding/decoding unit 24. The encoding/decoding unit 24 includes an encoding unit 25 and a decoding unit 26. The host I/F 21, the memory I/F 22, the control unit 23, the encoding unit 25, and the decoding unit 26 are connected to each other by an internal bus 20.

The host I/F 21 performs a process based on an interface standard with the host 4 and outputs, for example, commands and user data received from the host 4 to the internal bus 20. In addition, the host I/F 21 transmits, for example, user data read from the semiconductor memory unit 3 and a response from the control unit 23 to the host 4.

The memory I/F 22 controls a process of writing write data to the semiconductor memory unit 3 and a process of reading data from the semiconductor memory unit 3 in response to instructions from the control unit 23. The memory I/F 22 is connected to each of the memory packages 31-1 to 31-3 through signal lines and performs a reading process and a writing process for each channel.

The control unit 23 is a controller which generally controls each component of the memory controller 2. When receiving a command from the host 4 through the host I/F 21, the control unit 23 performs control corresponding to the command. For example, the control unit 23 instructs the memory I/F 22 to write a code word (user data and parity) to the semiconductor memory unit 3 and to read the code word from the semiconductor memory unit 3, in response to commands from the host 4. In addition, the control unit 23 determines whether to read data from the semiconductor memory unit 3 in the normal read mode or the fast read mode and controls the retrying of reading on the basis of the determination result of the decoding unit 26 indicating whether there is an error in user data.

The encoding unit 25 performs an error correction coding process on the basis of the user data transmitted to the internal bus 20. Any code may be used as an error correction code. For example, a BCH code or a Reed-Solomon (RS) code can be used. The encoding unit 25 performs the error correction coding process for each page to generate parity. That is, the encoding unit 25 generates parity for each page. In addition, the encoding unit 25 may generate parity for a unit of a plurality of pages. In such a case, when reading a given page, the encoding unit 25 reads a plurality of pages, which are used to generate the parity corresponding to data of the page, for decoding.

The decoding unit 26 determines whether there is an error in the user data on the basis of the code word (user data and parity) read from the semiconductor memory unit 3 and notifies the control unit 23 of the determination result. When there is no error in the user data, the decoding unit 26 outputs the user data read from the semiconductor memory unit 3 to the internal bus 20 as is. When there is an error in the user data, the decoding unit 26 corrects the error using the parity and outputs the user data to the internal bus 20, on the basis of instructions from the control unit 23.

In this embodiment, the control unit 23 determines whether to retry reading, on the basis of the determination result of the decoding unit 26 indicating whether there is an error in the user data.

Figure 2:
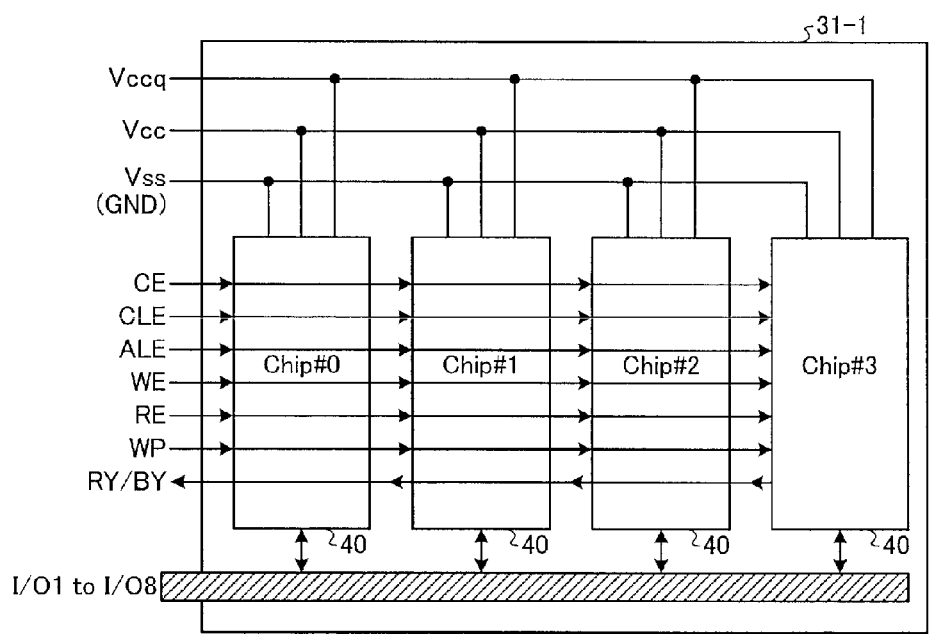
FIG. 2 is a diagram illustrating an example of a structure of a memory package according to the first embodiment.

Next, the fast read mode according to this embodiment will be described. FIG. 2 is a diagram illustrating an example of the structure of the memory package 31-1 according to this embodiment. The memory packages 31-2 and 31-3 have the same structure as the memory package 31-1. The memory package 31-1 includes four memory chips 40 (Chip#0 to Chip#3). The number of memory chips in the memory package 31-1 is not limited to four, but one or more memory chips may be provided in the memory package 31-1. In each memory chip 40, data is written or read in a unit of data which is called a page. As shown in FIG. 2, a control signal line for controlling the memory chip 40, an input/output (I/O) signal line to which commands, addresses, and data are transmitted, and a potential supply line are connected to the memory package 31-1. The control signal line includes a chip enable signal (CE), a command latch enable signal (CLE), an address latch enable signal (ALE), a write enable signal (WE), a read enable signal (RE), a write protect signal (WP), and a ready/busy signal (RY/BY). The potential supply line supplies a power supply potential Vcc, a power supply potential Vccq for an interface circuit, and a ground potential Vss. As shown in FIG. 2, the control signal line and the I/O signal line are commonly used across the multiple memory chips 40 in the memory package 31-1. In this embodiment, for example, the I/O signal line is an 8-bit signal line. However, the transmission width of the I/O signal line is not limited to 8 bits.

Figure 3:
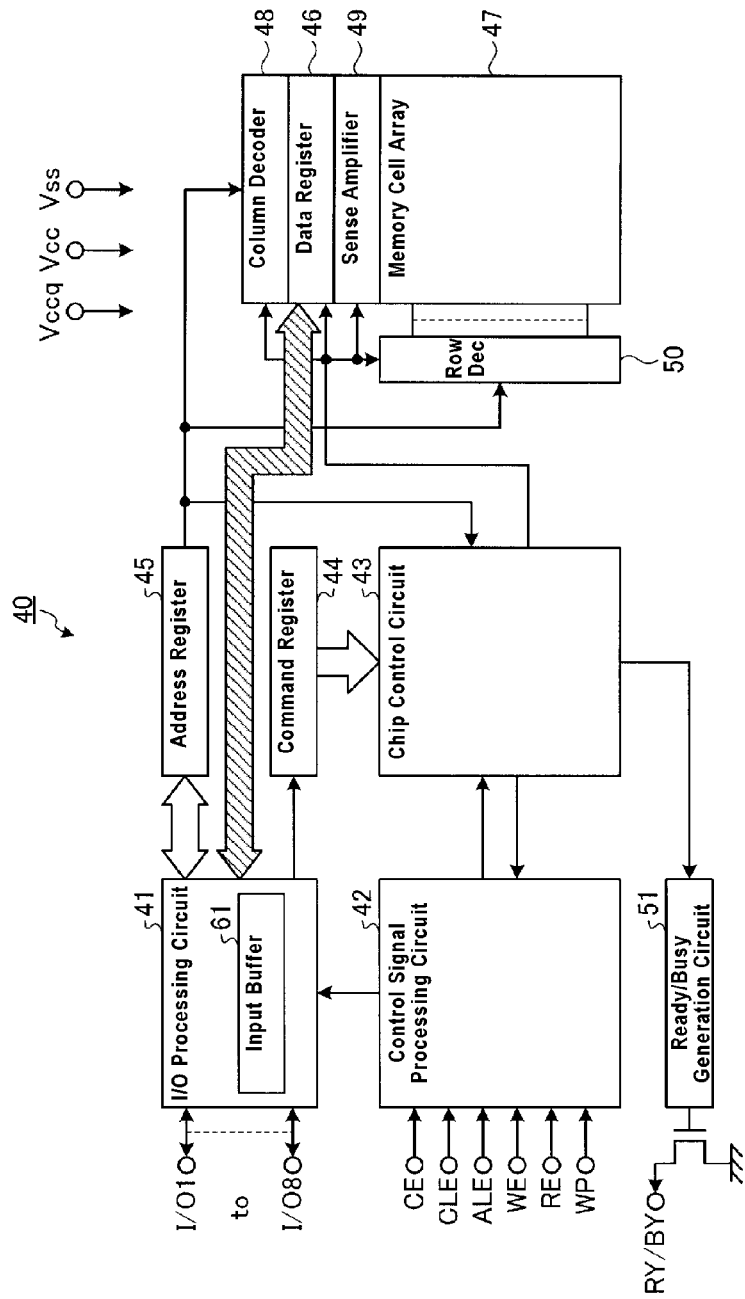
FIG. 3 is a block diagram illustrating an example of a structure of a memory chip.

FIG. 3 is a block diagram illustrating an example of the structure of the memory chip 40. As shown in FIG. 3, the memory chip 40 includes an I/O signal processing circuit 41, a control signal processing circuit 42 (control circuit), a chip control circuit 43, a command register 44, an address register 45, a data register 46, a memory cell array (storage area) 47, a column decoder 48, a sense amplifier 49, a row decoder 50, and an RY/BY generation circuit 51. The I/O signal processing circuit 41 is supplied with Vccq and Vss and the other circuits are supplied with Vcc and Vss.

The chip control circuit 43 is a state transition circuit (state machine) that changes a state on the basis of various control signals received through the control signal processing circuit 42 and controls the overall operation of the memory chip 40. The RY/BY generation circuit 51 changes the state of an RY/BY signal line between a ready state (RY) and a busy state (BY) under the control of the chip control circuit 43.

The I/O signal processing circuit 41 is a buffer circuit for transmitting and receiving I/O signals to and from the memory controller 2 through the I/O signal line. Specifically, the I/O signal processing circuit 41 includes an output buffer (not shown) for transmitting the I/O signal to the data transmission device 1 and an input buffer 61 for inputting the I/O signal into the memory chip 40.

Figure 4:
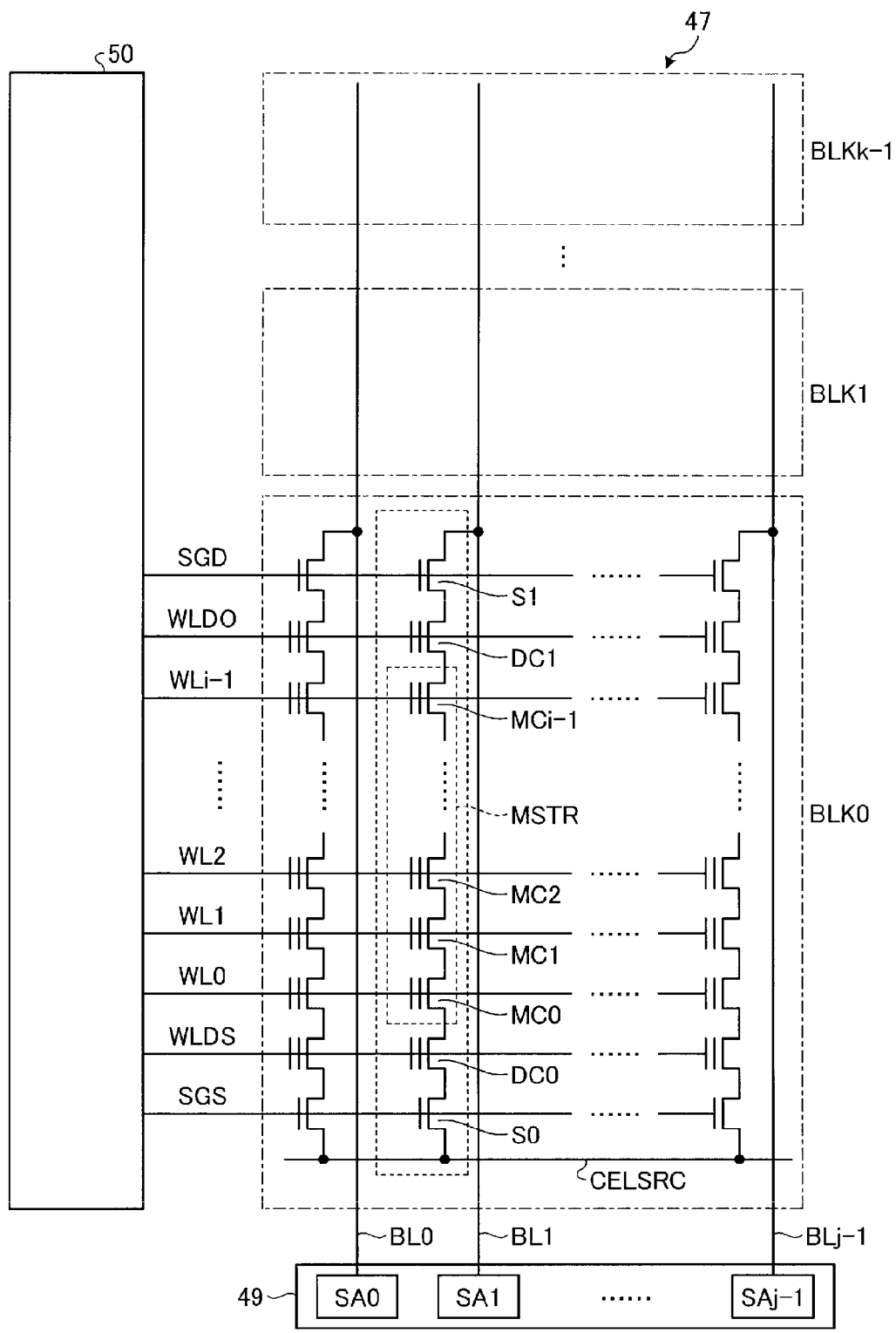
FIG. 4 is a diagram illustrating an example of a structure of a memory cell array of the memory chip.

FIG. 4 is a diagram illustrating an example of the structure of the memory cell array 47 of the memory chip 40. In FIG. 4, a memory cell unit includes a memory string MSTR including i memory cells MC0 to MCi-1 which are connected in series to each other and select gate transistors S0 and S1 which are connected respectively to opposite ends of the memory string MSTR. A source of the select gate transistor S0 is connected to a common source line CELSRC and a drain of the select gate transistor S1 is connected to a bit line BL (BL0 to BLj-1). Control gates of the memory cells MC0 to MCi-1 are connected to word lines WL (WL0 to WLi-1) and the gates of the select gate transistors S0 and S1 are connected to select gate lines SGS and SGD, respectively. The memory cell from which data is read is selected by the select gate lines SGS and SGD and the bit line. As shown in FIG. 4, the sense amplifier 49 includes a plurality of sense amplifier circuits (SA: SA0 to SAj-1 in FIG. 4).

Figure 5:
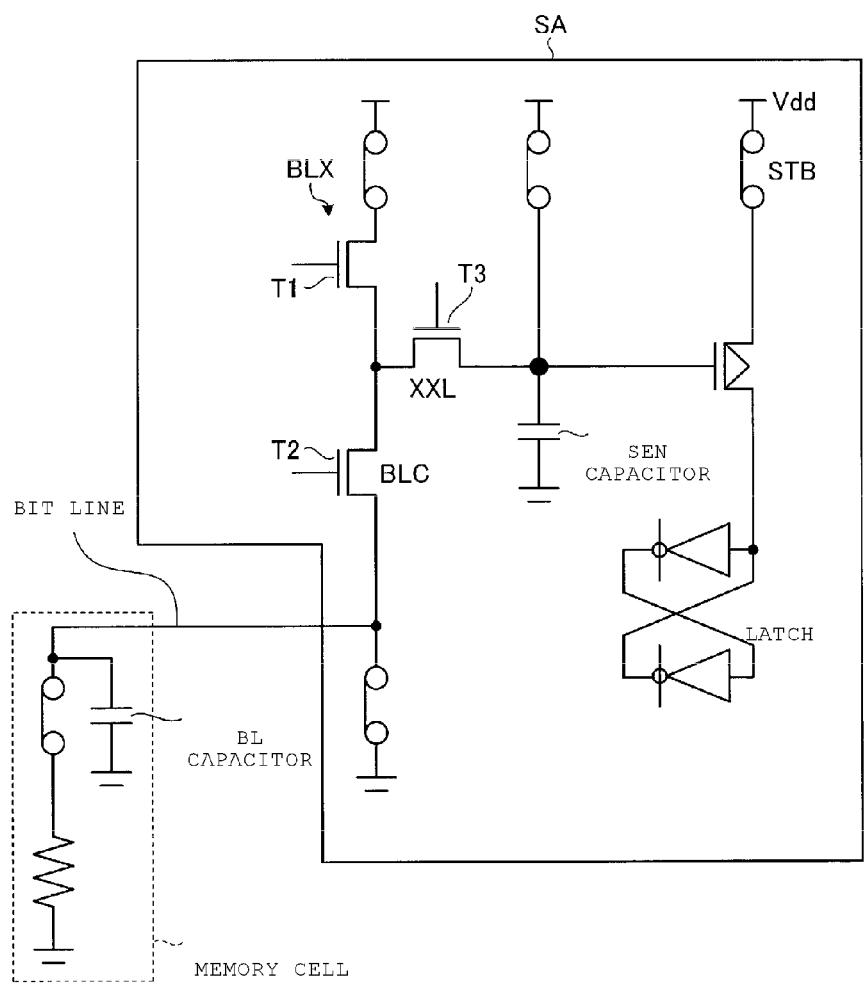
FIG. 5 is a diagram illustrating an example of a structure of a sense amplifier circuit (SA).

FIG. 5 is a diagram illustrating an example of the structure of the sense amplifier circuit (SA) according to this embodiment. FIG. 5 shows elements used for the description of this embodiment. In this embodiment, an all-bit-line (ABL) architecture which senses all bit lines at the same time is described as an example. The sense amplifier circuit includes nMOS transistors T1 to T3, a SEN capacitor (a capacitor connected to a sense node (a black circle in FIG. 5)), and a latch circuit. Gate voltages of the nMOS transistors T1, T2, and T3 are represented by BLX, BLC, and XXL, respectively. It is assumed that a threshold value of the nMOS transistors T1, T2, and T3 is Vt.

Figure 6:
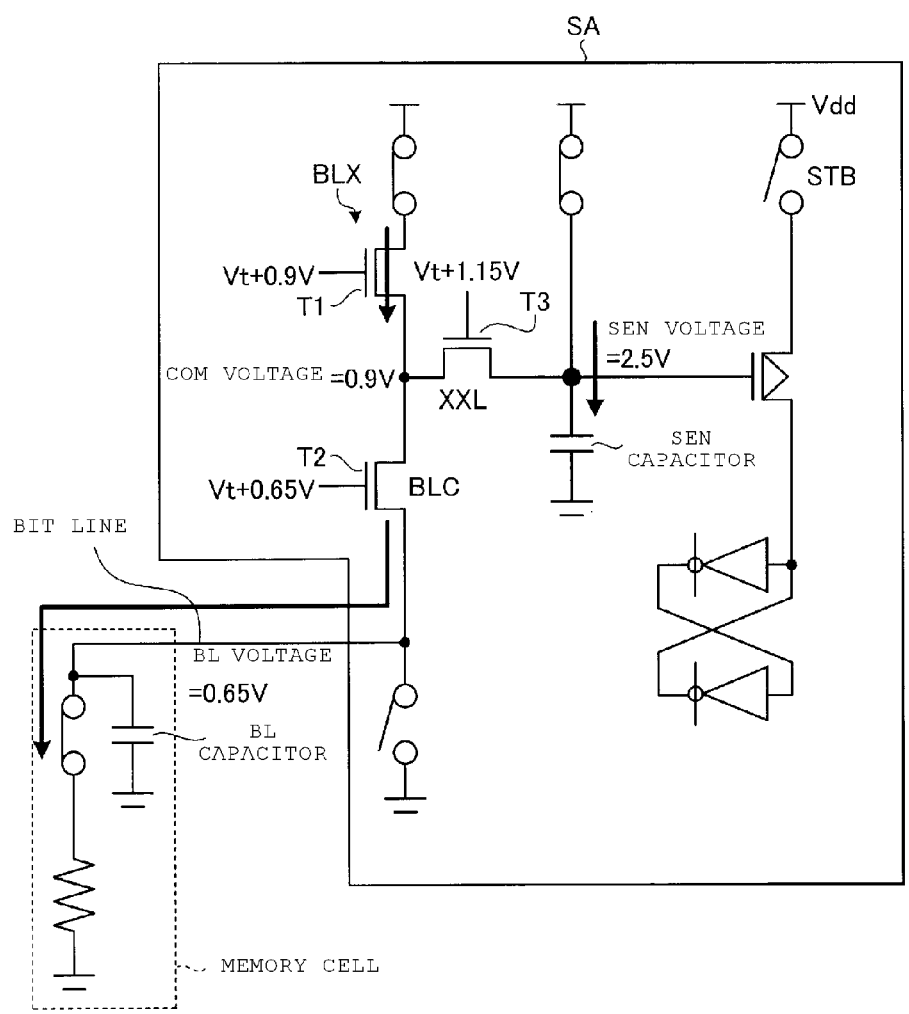
FIG. 6 is a diagram illustrating pre-charging of a bit line and a sense node when a selected cell holds data with a value of "1".

FIG. 6 is a diagram illustrating a pre-charging of the bit line and the sense node, when a selected cell holds data with a value of "1" in the memory cell unit connected to the bit line to which the SA is connected. In this example, BLX=Vt+0.9 V, BLC=Vt+0.65 V, XXL=Vt+1.15 V are established, the bit line is pre-charged with 0.65 V, and the sense node (SEN) is pre-charged with 2.5 V. A COM voltage is clamped at T1 and is 0.9 V. Since the memory cell has data "1", that is, the memory cell is in an on state, a current flows and the bit line and the sense node are pre-charged.

Figure 7:
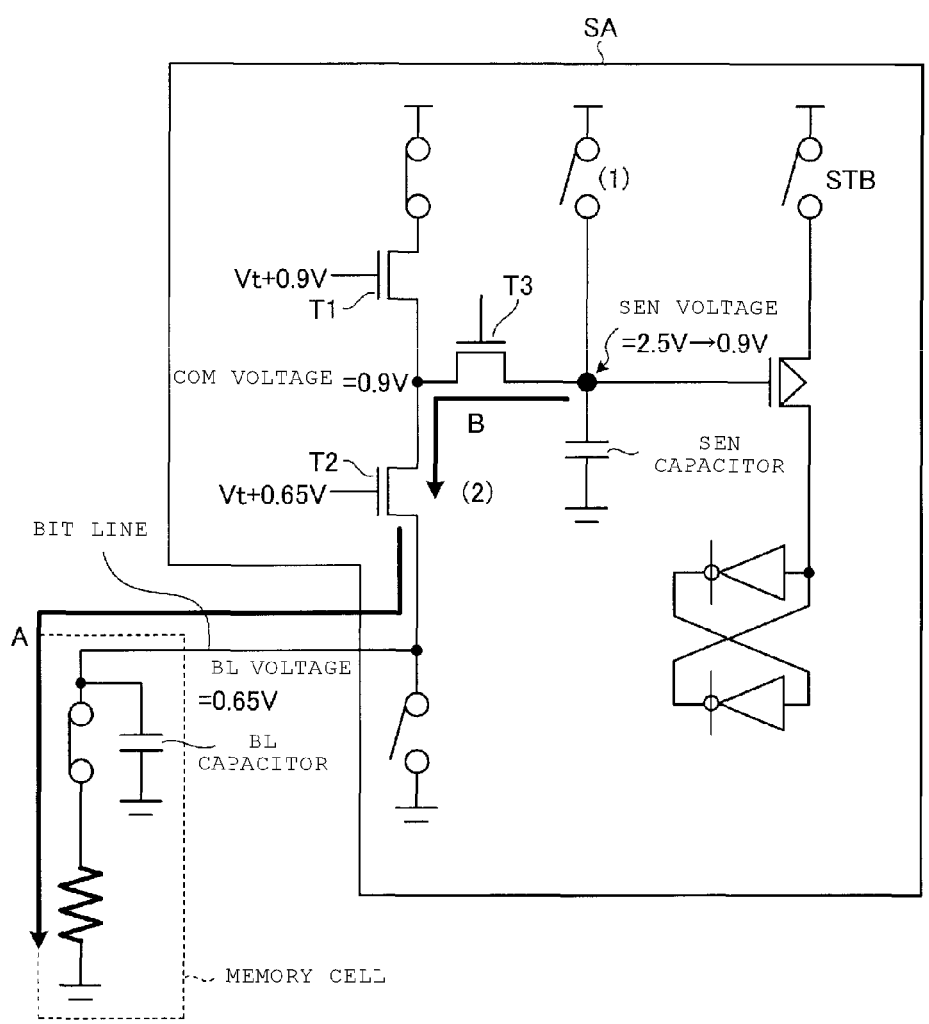
FIG. 7 is a diagram illustrating discharging of a sense voltage when the selected cell holds data with a value of "1".
Figure 8:
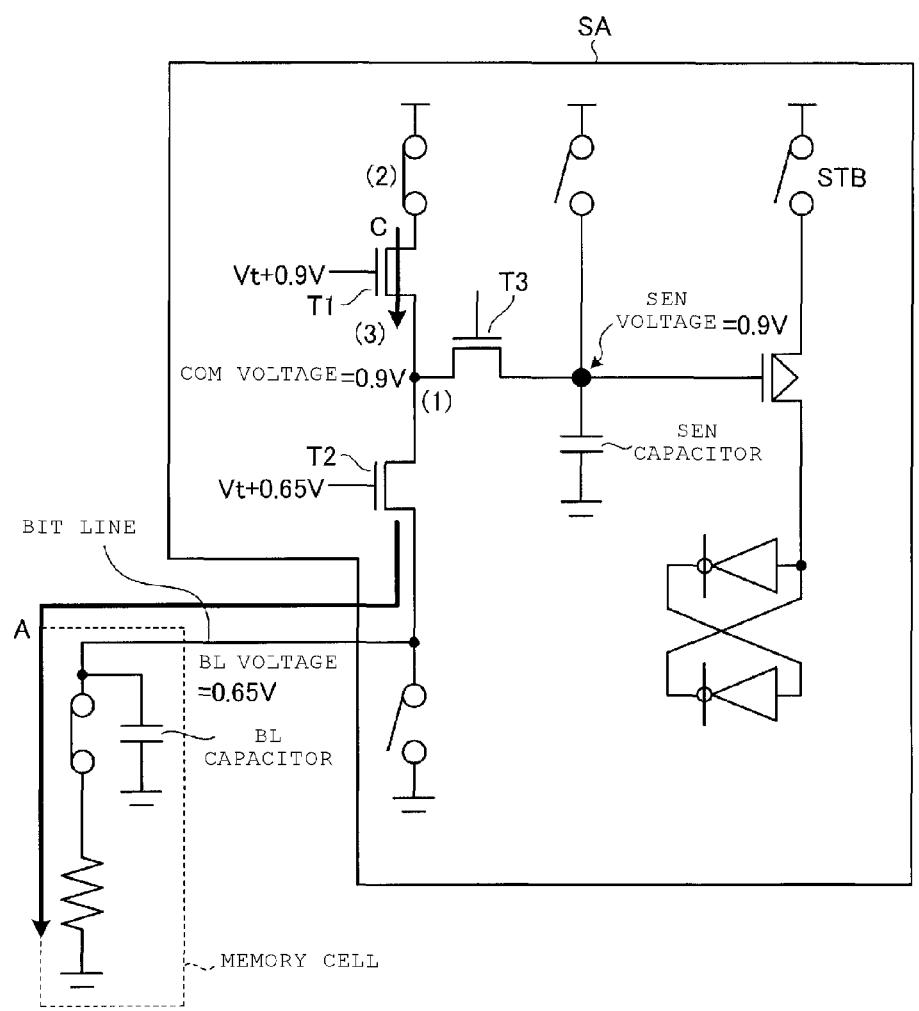
FIG. 8 is a diagram illustrating discharging of the sense voltage when the selected cell holds data with a value of "1".

FIGS. 7 and 8 illustrate discharging of a sense voltage when the selected cell holds data with a value of "1". After the pre-charging shown in FIG. 6, the SEN capacitor is charged as shown in (1) of FIG. 7. Then, as shown in (2) of FIG. 7, a current B is drawn to a current A and flows. Therefore, a SEN voltage (voltage at the SEN node) becomes 0.9 V due to discharge. Since a cell current (current A) is kept flowing, source line noise (floating) increases and a latch operation, which will be described below, is less likely to be correctly performed in the cell in which the cell current is less likely to flow. Therefore, in a general sensing process, two reading operations (two sensing operations) are needed. The source line is common to all blocks. The first read operation reads data from the cell in which the cell current is likely to flow. The second read operation reduces source line noise and reads data from the cell in which the current is less likely to flow.

Then, as shown in (1) of FIG. 8, the SEN voltage becomes 0.9 V and the current A flows through the SEN node, and the COM voltage is lower than 0.9 V. As shown in (2) of FIG. 8, a current C flows and the COM voltage is charged. As a result, as shown in (3) of FIG. 8, the COM voltage is maintained at 0.9V. The bit line voltage is maintained at 0.65 V. That is, during the discharge of the SEN voltage, there is no change in the bit line voltage. Therefore, it is not necessary to shield adjacent bit lines.

Figure 9:
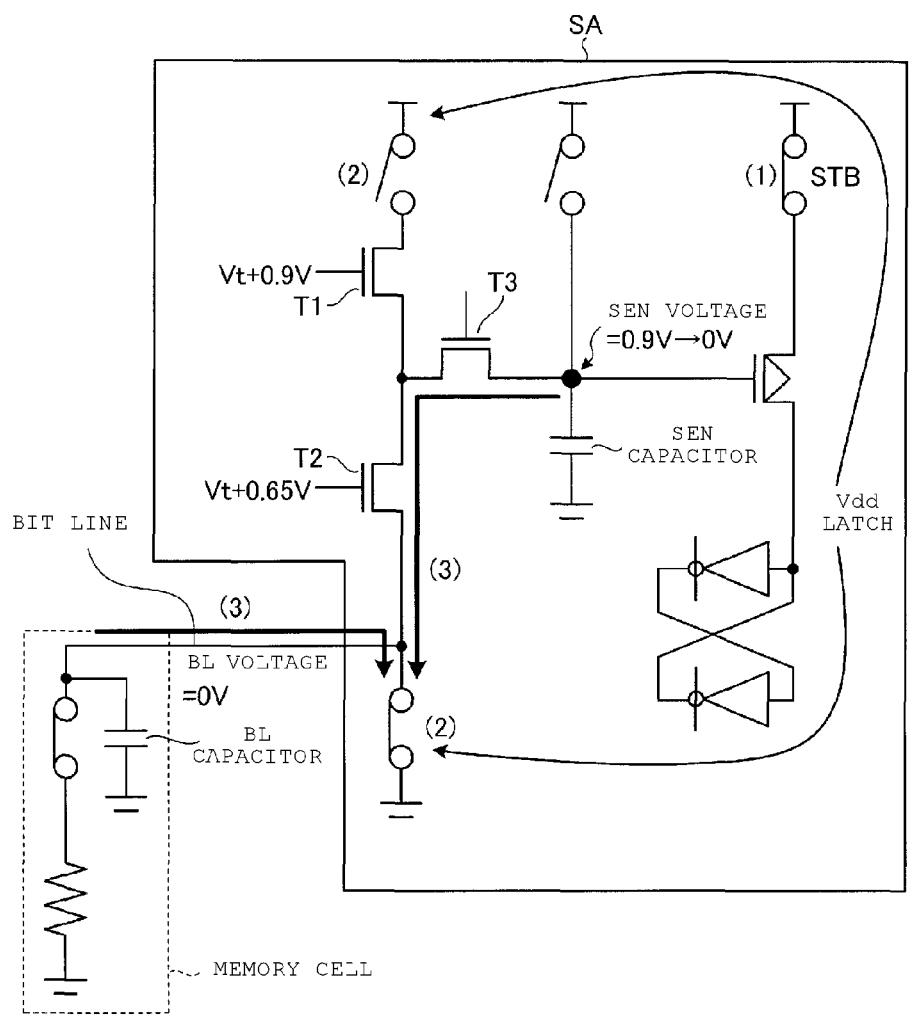
FIG. 9 is a diagram illustrating sensing when the selected cell holds data with a value of "1".

FIG. 9 is a diagram illustrating sensing when the selected cell holds data with a value of "1". When the SEN voltage is lower than 0.9 V after the discharge of the sense voltage shown in FIGS. 7 and 8, a switch which is connected to Vdd is turned on and Vdd is supplied to the SA and is held and latched in a latch circuit as shown in (1) of FIG. 9. When Vdd is held in the latch circuit, the supply of Vdd for the cell current is stopped and the discharge to Vss starts, as shown in (2) of FIG. 9. Therefore, the bit line voltage and the SEN voltage are discharged, as shown in (3) of FIG. 9. In this way, the first sensing operation ends. As such, when Vdd is latched in the latch circuit by a reduction in the SEN voltage, the sense amplifier circuit can detect that the value of the selected cell is "1".

Figure 10:
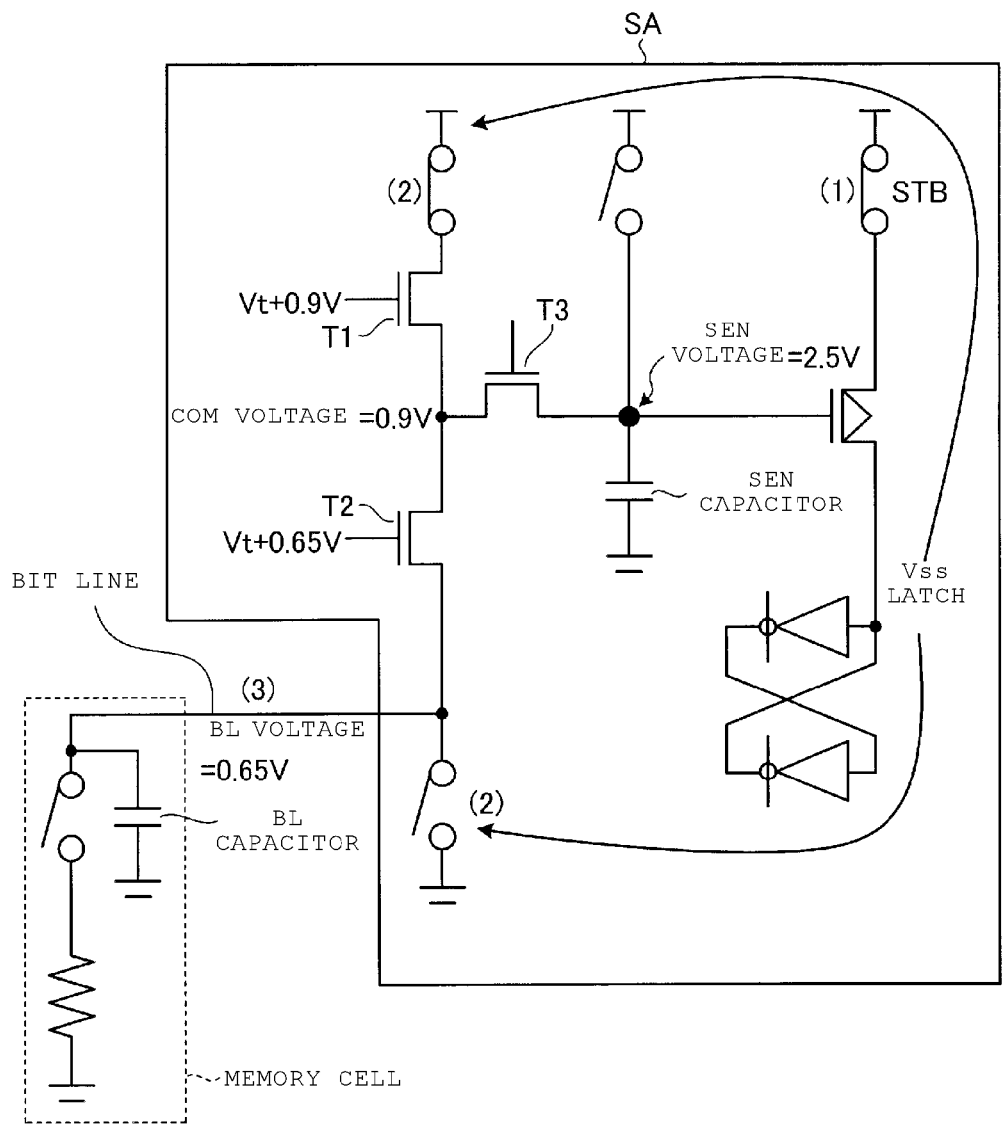
FIG. 10 is a diagram illustrating sensing when the selected cell holds data with a value of "0".

FIG. 10 shows an aspect of sensing when the selected cell holds data with a value of "0". When the selected cell has a value of "0", pre-charging is performed similarly to FIG. 6. When the selected cell has a value of "0", that is, the memory cell is turned off, the SEN voltage is not discharged and is 2.5 V. As shown in (3) of FIG. 10, the bit line (BL) voltage is maintained at 0.65 V. In this state, even when the switch STB shown in (1) of FIG. 10 is turned on, the latch circuit holds Vss. As shown in (2) of FIG. 10, since the latch circuit holds Vss, Vdd is continuously supplied and the discharge to Vss does not occur. Since Vss is maintained in the latch circuit, the sense amplifier circuit can detect that the value of the selected cell is "0".

As described above, in general (in the normal mode), the sensing operation is performed two times. In contrast, in the fast read mode, the sensing operation is performed once. Therefore, it is possible to reduce the time required for the reading operation, as compared to the normal read mode. In this embodiment, the sensing operation is performed two times in the normal read mode and is performed once in the fast read mode. However, the number of sensing operations in the normal mode and the fast mode is not limited to two and one, respectively, but may be any two numbers so long as the number of sensing operations in the fast read mode is less than that in the normal read mode. In the fast read mode, the read time can be reduced by reducing the sense time (the discharge time of the SEN).

Figure 11:
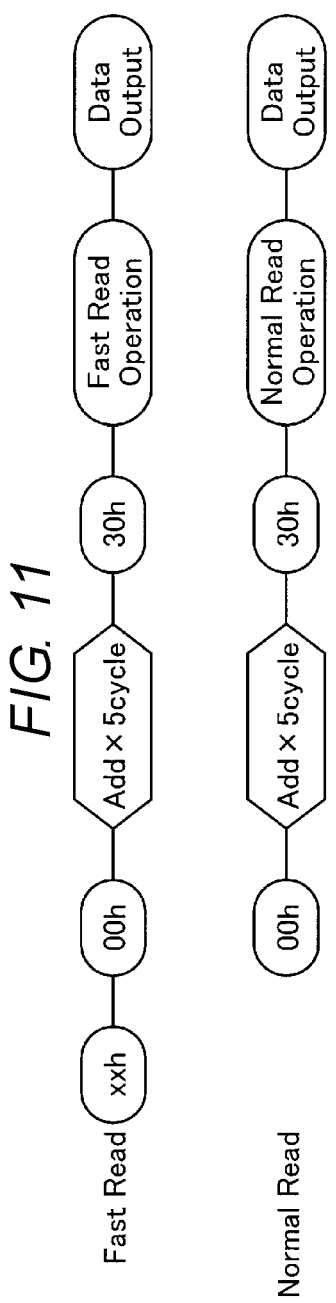
FIG. 11 is a diagram illustrating an example of a command sequence in a fast read mode.

FIG. 11 is a diagram illustrating an example of a command sequence in the fast read mode. FIG. 11 shows an example in which a 2-bit/cell MLC (multi-level cell) is used as the memory cell of the semiconductor memory unit 3. The upper side of FIG. 11 shows an example of the command sequence in the fast read mode and the lower side of FIG. 11 shows an example of the command sequence in the normal read mode. As shown in FIG. 11, in the fast read mode, xxh (xx is an arbitrary value) is added to the head, as compared to the command sequence in the normal read mode. In the fast read mode, a 5-cycle address (Add) is arranged between commands 00h and 30h indicating reading after xxh which is disposed at the head. After the command 30h, a data read operation is performed. In the data (user data and parity) read operation, a fast read operation is performed in the fast read mode shown in the upper side of FIG. 11 and a normal read operation is performed in the normal read mode shown in the lower side of FIG. 11. The time tR (READ transfer time) required for the fast read operation is shorter than the time required for the normal read operation since the sense time and/or the number of sensing operations is less than that in the normal read mode, as described above. Also, in the cases of a single-level cell (SLC), and a triple-level cell (TLC), in the fast read mode, xxh may be added to the head of the command sequence in the normal read mode. The command sequence shown in FIG. 11 is an illustrative example and any sequence may be used as long as it can distinguish the normal read mode and the fast read mode.

In this example, as described above, the command is used to designate one of the fast read mode and the normal read mode (reading method). However, the embodiment is not limited thereto, but one of the fast read mode and the normal read mode may be designated by setting parameters (a change in internal parameters). The control unit 23 of the memory controller 2 determines whether to use the fast read mode or the normal read mode (reading method). When using commands, the control unit 23 of the memory controller 2 transmits an instruction for the reading method to the memory I/F 22. The memory I/F 22 inputs a command corresponding to the instruction from the control unit 23 to the semiconductor memory unit 3. In the semiconductor memory unit 3, the control signal processing circuit 42 controls, for example, the sense amplifier 49 in response to the received command and implements the normal read operation or the fast read operation. If the reading method is designated by setting the parameters, when changing the reading method, the control unit 23 transmits an instruction to change the internal parameters to the semiconductor memory unit 3 through the memory I/F 22.

Figure 12:
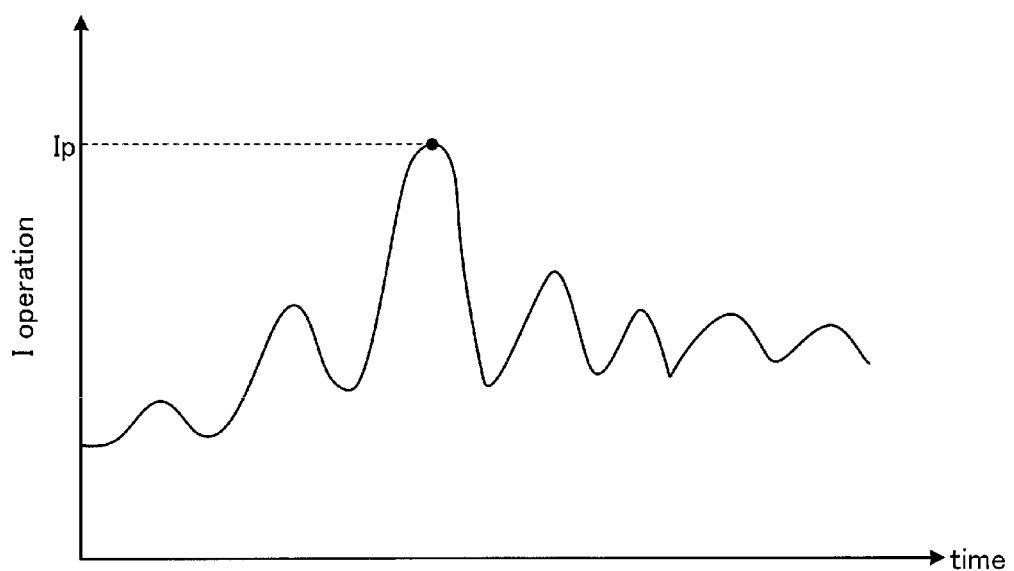
FIG. 12 is a schematic diagram illustrating the concept of a peak current.

In the fast read mode according to this embodiment, since the sense time of the sense amplifier circuit is reduced, a peak current Ip (peak value) of a current Ioperation (operation current) which flows from Vcc to Vss for a read operation period is more than that in the normal read mode. FIG. 12 is a schematic diagram illustrating the concept of the peak current Ip. In the fast read mode, the peak current Ip is more than that in the normal read mode. In addition, an average current Iave (average value) of the current Ioperation (operation current) which flows from Vcc to Vss for the read operation period is more than that in the normal read mode.

As described above, in the fast read mode, the time tR required for the read operation is reduced. However, since the sense time and/or the number of sensing operations is reduced, the accuracy of the read data is lower than that in the normal read mode. When there is an error in the read data as described below, reading is retried to compensate for the error.

Figure 13:
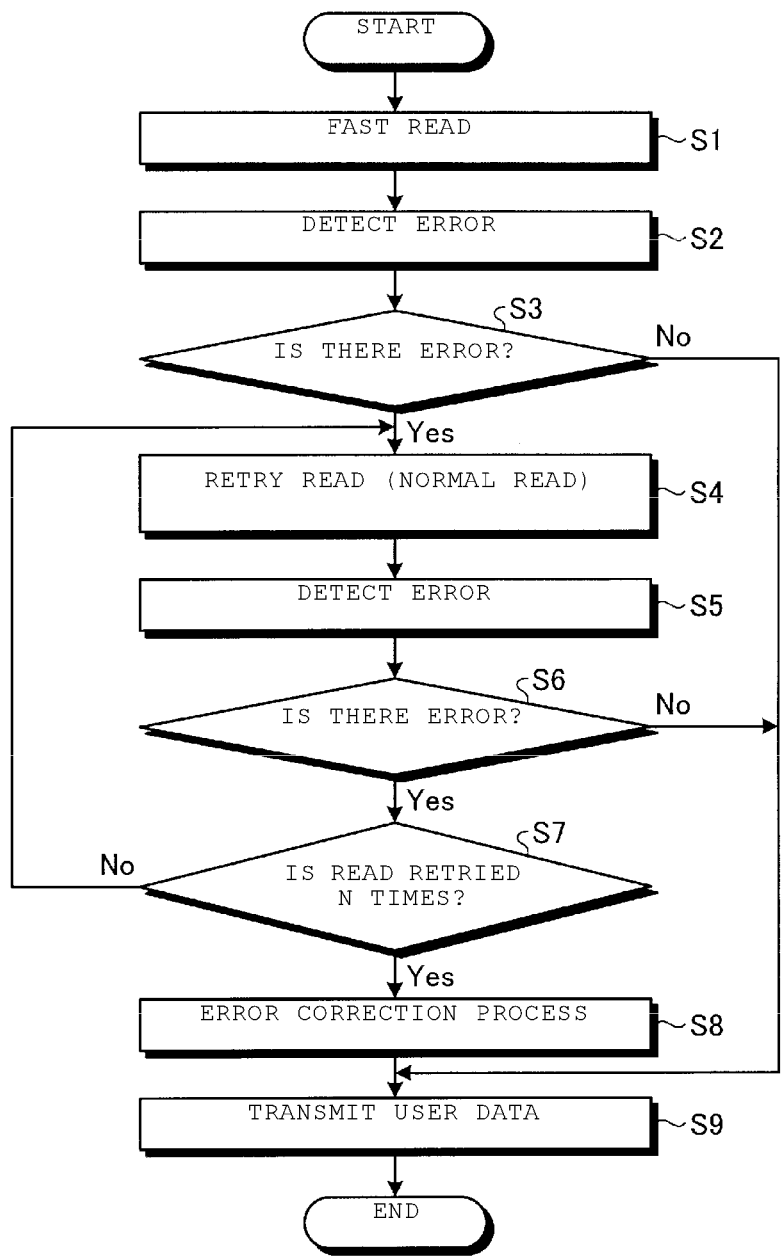
FIG. 13 is a diagram illustrating an example of an operation sequence when data is read in the fast read mode according to the embodiment.

FIG. 13 is a diagram illustrating an example of a procedure when a read operation is performed in the fast read mode according to this embodiment. As shown in FIG. 13, in the fast read mode, the control unit 23 of the memory controller 2 instructs the memory I/F 22 to read data (user data and parity) in the fast read mode (Step S1). The memory I/F 22 inputs a fast read command to the semiconductor memory unit 3 (or sets parameters) and reads the user data and parity from the semiconductor memory unit 3.

The control unit 23 of the memory controller 2 instructs the decoding unit 26 to start a decoding process. The decoding unit 26 performs an error detection process on the basis of the user data and parity read from the semiconductor memory unit 3 and notifies the control unit 23 of information indicating whether there is an error in the user data (Step S2).

The control unit 23 determines whether there is an error in the user data on the basis of the notice from the decoding unit 26 (Step S3). When there is an error (Yes in Step S3), the control unit 23 retries the read operation and instructs the reading (re-reading) of data (user data and parity) in the normal read mode (Step S4). The control unit 23 of the memory controller 2 instructs the decoding unit 26 to start a decoding process. The decoding unit 26 performs an error detection process on the basis of the user data and parity read from the semiconductor memory unit 3 in the normal read mode and notifies the control unit 23 of information indicating whether there is an error in the user data (Step S5).

The control unit 23 determines whether there is an error in the user data on the basis of the notice from the decoding unit 26 (Step S6). When there is an error (Yes in Step S6), the control unit 23 determines whether the read operation is retried N times (N is an integer equal to or greater than 1) (Step S7). When the read operation is retried N times, the control unit 23 instructs the decoding unit 26 to perform an error correction process (Step S8). The decoding unit 26 calculates an error position on the basis of the read user data and parity and inverts the bit value of the calculated position to perform the error correction process. Then, the control unit 23 transmits the user data (the user data after the error correction process or the read user data when there is no error) to the host 4 through the host I/F 21 (Step S9) and ends the process.

When it is determined in Step S3 that there is no error (No in Step S3) and when it is determined in Step S6 that there is no error (No in Step S6), the process proceeds to Step S9. When it is determined in Step S7 that the read operation is not retried N times (No in Step S7), the process returns to Step S4.

In the example shown in FIG. 13, reading is retried in the normal read mode. However, a shift read operation which performs reading using a read voltage different from that in the normal read mode may be performed in one or more read retries among N retries. For example, the first read retry may be the normal read operation and the second read retry may be the shift read operation. In addition, the read time may be delayed to retry the read operation with higher reliability.

As described above, in this embodiment, the sense time and/or the number of sensing operations of the sense amplifier circuit is reduced to shorten the time tR required for the read operation, as compared to the normal read mode. Therefore, it is possible to increase the speed of the read operation and improve the random read performance. In addition, when there is an error in the read data, reading is retried in the normal read mode. Therefore, it is possible to prevent a reduction in the accuracy of reading data.

Second Embodiment

Next, a reading method according to a second embodiment will be described. A semiconductor memory device according to this embodiment has the same structure as the semiconductor memory device 1 according to the first embodiment. Hereinafter, the difference from the first embodiment will be described. The description of components having the same functions as those in the first embodiment will not be repeated. The components having the same functions as those in the first embodiment will be described using the same reference numerals as those in the first embodiment.

In the first embodiment, the sense time and/or the number of sensing operations of the sense amplifier circuit is reduced to shorten the time tR required for the read operation. In the fast read mode according to the second embodiment, a BL charging time and/or a WL charging time is less than that in the normal read mode to shorten the time tR required for the read operation. In this case, in the fast read mode, the peak current Ip and average current Iave (average value) of an operation current are more than those in the normal read mode.

Figure 14:
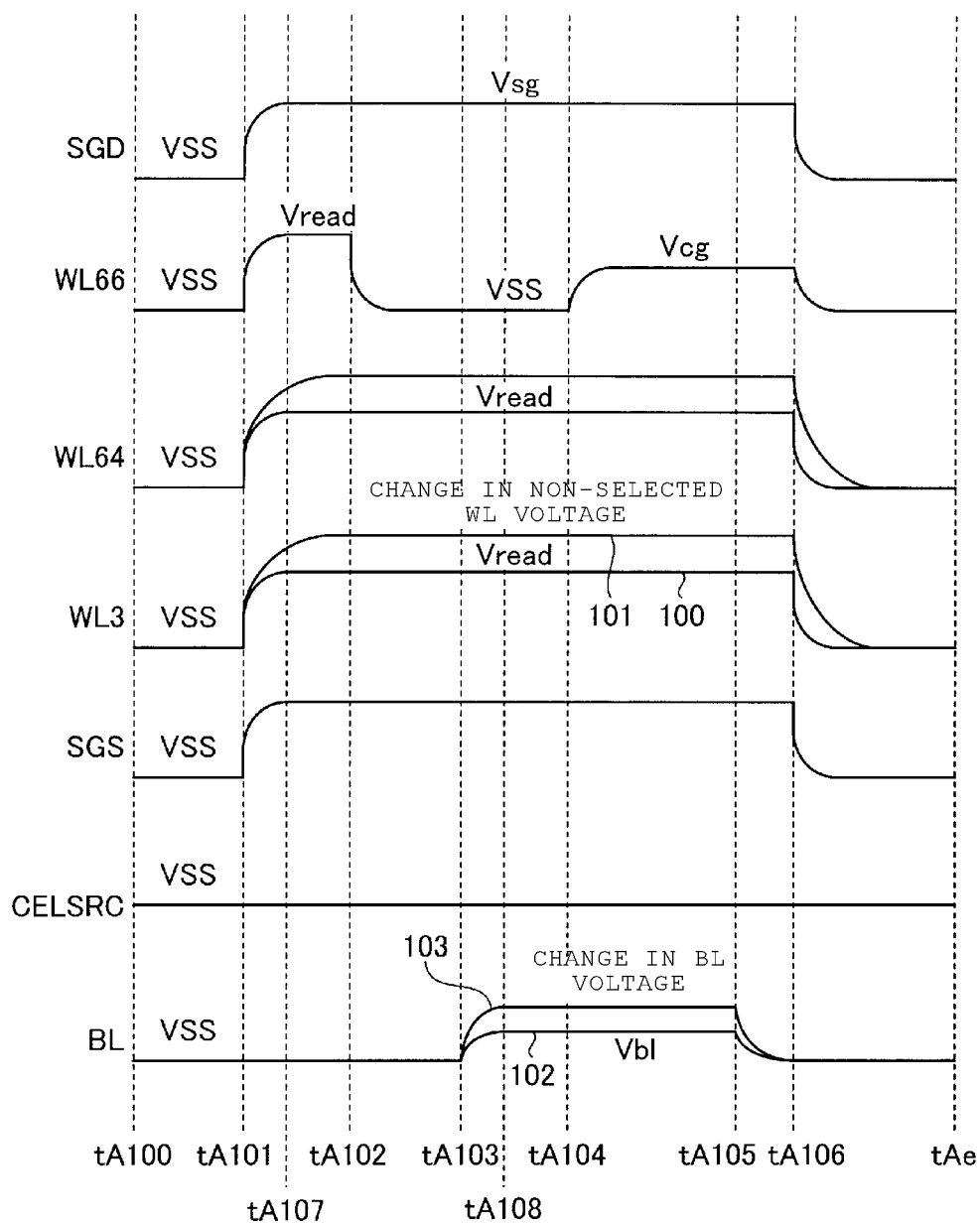
FIG. 14 is a diagram illustrating an example of a timing chart during a read operation according to a second embodiment.

FIG. 14 is a diagram illustrating an example of a timing chart during a read operation in the second embodiment. Here, a case in which a memory cell corresponding to WL66 is read will be described. The period from a time tA100 to a time tA101 is an initial state. For the period from the time tA101 to a time tA102, the voltage of select gate lines SGS and SGD are raised from the initial state to a voltage Vsg (for example, 3.5 V). In addition, the voltage of word lines WL3 to WL66 is raised to a voltage Vread (for example, 6 V). As a result, a bit line BL and a common source line CELSRC are electrically connected to each other and the channel potential of a memory cell MC is initialized. In some cases, the application of a voltage to SGS and SGD, a selected WL, and non-selected WLs for the period from the time tA101 to the time tA102 is omitted or it is changed at a different time.

Then, for the period from the time tA102 to a time tA103, the selected word line WL66 is discharged to, for example, a voltage Vss (0 V). Then, for the period from the time tA103 to a time tA104, the bit line BL is charged to a voltage Vbl (for example, 0.5 V). Then, for the period from the time tA104 to a time tA105, a voltage Vcg (for example, 0.5 V) required to read data is applied to the selected word line WL66. As a result, the voltage of the bit line BL varies depending on data stored in a selected memory cell MC66. A sense amplifier circuit SA detects the variation in the voltage to determine the value of the data. However, in the example in which the period from the time tA104 to the time tA105 is the sense time and the sense time described in the first embodiment is reduced, in the fast read mode, the sense time is reduced to shorten the reading time.

Then, for the period from the time tA105 to a time tA106, the bit line BL is discharged to, for example, the voltage Vss (0 V). Finally, for the period from the time tA106 to a time tAe, the voltage of the select gate lines SGD and SGS and the word lines WL3 to WL66 is discharged.

When the above-mentioned operation is performed, the voltage of the non-selected WLs (in FIG. 14, WL3 and WL64) has a different value in the normal read mode and the fast read mode. A normal read voltage 100 shown in FIG. 14 indicates an example of the profile of the voltage of the non-selected WL in the normal read mode and a fast read voltage 101 indicates an example of the profile of the voltage of the non-selected WL in the fast read mode. As shown in FIG. 14, in the fast read mode, the voltage Vread of the non-selected WL is higher than that in the normal read mode or the supply capability of a transistor which transmits the voltage Vread is increased. In this way, the WL charging time is the period from the time tA101 to the time tA102 in the normal read mode, but can be reduced to the period from the time tA101 to a time tA107 in the fast read mode. In addition, it is possible to reduce the period from the time tA102 to the time tA103. Therefore, in the fast read mode, after the time tA107, it is possible to perform the process after the time tA102 in the normal read mode (in FIG. 14, a profile in which the process after the time tA102 in the fast read mode is advanced is omitted for commonality in the drawings) and shorten the period from the time tA101 to the time tA103 as a whole.

When the above-mentioned operation is performed, the BL voltage has a different value in the normal read mode and the fast read mode. In FIG. 14, a normal read BL voltage 102 indicates an example of the profile of a BL voltage in the normal read mode and a fast read BL voltage 103 indicates an example of the profile of the BL voltage in the fast read mode. As shown in FIG. 14, in the fast read mode, Vbl is higher than that in the normal read mode. Therefore, the BL charging time is the period from the time tA103 to the time tA104 in the normal read mode, but can be reduced to the period from the time tA103 to a time tA108 in the fast read mode. Therefore, in the fast read mode, after the time tA108, it is possible to perform the process after the time tA104 in the normal read mode (in FIG. 14, a profile in which the process after the time tA104 in the fast read mode is advanced is omitted for commonality in the drawings) and shorten the read time by "the period from the time tA103 to the time tA104"–"the period from the time tA103 to the time tA108" as a whole.

In the above-mentioned example, the values of Vread and Vbl are changed to reduce the WL charging time and the BL charging time. However, a gradient (dV/dt: the change rate of a voltage to time) for increasing Vread and Vbl may be increased to reduce the WL charging time and the BL charging time. In addition, the Vbl fast read mode, one or both of the WL charging time and the BL charging time may be reduced. Other methods with the same concept can be used to reduce the charging time. For example, similarly, the BL discharge time and/or the WL discharge time may be reduced. In addition, both the BL charging time and/or the WL charging time and the BL discharge time and/or the WL discharge time may be reduced.

Figure 15:
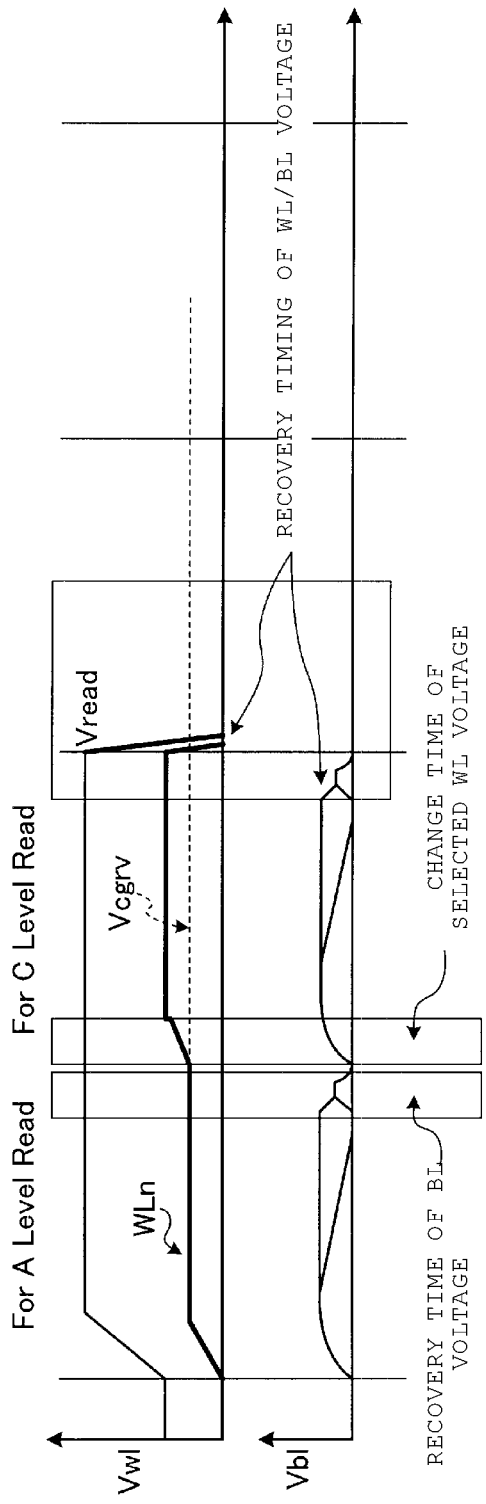
FIG. 15 is a diagram illustrating an example of a change in a word line voltage and a bit line voltage.
Figure 16:
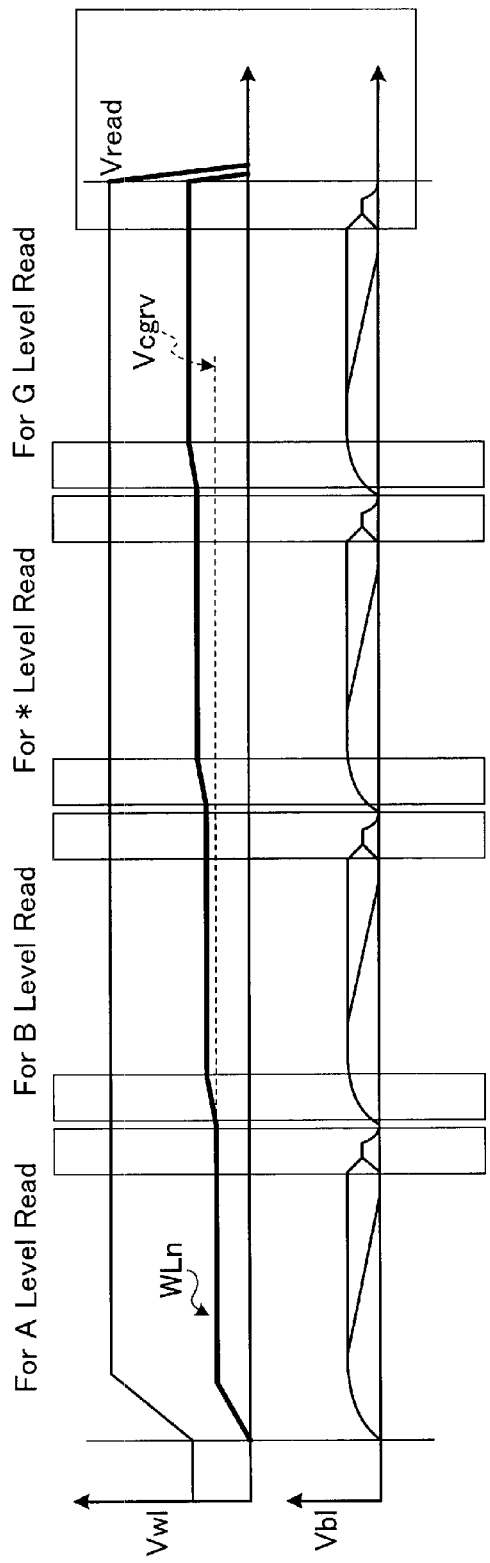
FIG. 16 is a diagram illustrating an example of a change in the word line voltage and the bit line voltage.

FIGS. 15 and 16 are diagrams illustrating an example of the aspect of a change in a word line voltage Vwl and a bit line voltage Vbl. FIG. 15 shows an example of the reading of an upper page of MLC (2 bit/cell) and FIG. 16 shows an example of the reading of TLC (3 bit/cell). Read threshold values of MLC are A, B, and C and read threshold values of TLC are A, B, . . . , G. In this embodiment, in the fast read mode, the change time of the selected WL voltage, the recovery time of the BL voltage, or the recovery time of the WL/BL voltage is less than that in the normal read time. Therefore, it is possible to reduce the read time.

The operation and read command of this embodiment are the same as those of the first embodiment except for the above. As shown in FIG. 13 in the first embodiment, reading is retried to prevent the accuracy of reading data from being reduced.

As described above, in this embodiment, at least one of the BL charging time, the WL charging time, the BL discharge time, and the WL discharge time is reduced to shorten the time tR of the fast read operation, as compared to the normal read mode. Therefore, it is possible to increase the speed of the read operation and improve the random read performance. In addition, when there is an error in the read data, reading is retried in the normal read mode to prevent the accuracy of reading data from being reduced. In the fast read mode, the reduction in the BL charging time and/or the WL charging time described in this embodiment and the reduction in the number of sensing operations described in the first embodiment both may be performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a first nonvolatile semiconductor memory chip; and
   a controller circuit configured to access the first nonvolatile semiconductor memory chip, wherein
   the first nonvolatile semiconductor memory chip sets a parameter therein in accordance with an instruction from the controller circuit, and sets an operation mode thereof to one of first and second modes indicated by the parameter,
   the controller circuit sends to the first nonvolatile semiconductor memory chip a first request for reading from a first address,
   if the first nonvolatile semiconductor memory chip is in the first mode, the first nonvolatile semiconductor memory chip is capable of performing a first read operation in response to the first request and outputting a first busy signal to the controller circuit during the first read operation, if the first nonvolatile semiconductor memory chip is in the second mode, the first nonvolatile semiconductor memory chip is capable of performing a second read operation in response to the first request and outputting a second busy signal to the controller circuit during the second read operation, a period of the first busy signal is shorter than a period of the second busy signal, the first nonvolatile semiconductor memory chip outputs first data to the controller circuit, and after the outputting the first data, the first nonvolatile semiconductor memory chip keeps staying in the operation mode indicated by the parameter at the time of the receiving the first request, until the parameter is changed.

2. The storage device of claim 1, the storage device further comprising a second nonvolatile semiconductor memory chip that is physically separated from the first nonvolatile semiconductor memory chip.

3. The storage device of claim 2, wherein the first and second nonvolatile semiconductor memory chips are incorporated in different packages.

4. The storage device of claim 1, wherein the controller circuit sets the operation mode of the first nonvolatile semiconductor memory chip into the first mode, the first nonvolatile semiconductor memory chip which outputs the first data to the controller circuit is in the first mode, the controller circuit determines whether or not an error in the first data is correctable, the controller circuit sets the operation mode of the first nonvolatile semiconductor memory chip into the second mode if the controller circuit determines that the error in the first data is uncorrectable, and the controller circuit sends to the first nonvolatile semiconductor memory chip in the second mode a second request for reading from the first address.

5. The storage device of claim 1, wherein the first request includes a first command, the first address, and a second command.

6. The storage device of claim 5, wherein the first command is 00h, and the second command is 30h.

7. The storage device of claim 1, wherein the first nonvolatile semiconductor memory chip is a NAND flash memory.

8. A storage device comprising:

a first nonvolatile semiconductor memory chip; and a controller circuit configured to access the first nonvolatile semiconductor memory chip, wherein the first nonvolatile semiconductor memory chip sets a parameter therein in accordance with an instruction from the controller circuit, and sets an operation mode thereof to one of first and second modes indicated by the parameter, the controller circuit sends to the first nonvolatile semiconductor memory chip a first request for reading from a first address, if the first nonvolatile semiconductor memory chip is in the first mode, the first nonvolatile semiconductor memory chip is capable of performing a first read operation in response to the first request and informing to the controller circuit, during a first period in the first read operation, that the first nonvolatile semiconductor memory chip is in a busy state, if the first nonvolatile semiconductor memory chip is in the second mode, the first nonvolatile semiconductor memory chip is capable of performing a second read operation in response to the first request and informing to the controller circuit, during a second period in the second read operation, that the first nonvolatile semiconductor memory chip is in a busy state, and the first period is shorter than the second period, the first nonvolatile semiconductor memory chip outputs the first data to the controller circuit, and after the outputting the first data, the first nonvolatile semiconductor memory chip keeps staying in the operation mode indicated by the parameter at the time of the receiving the first request, until the parameter is changed.

9. The storage device of claim 8, the storage device further comprising a second nonvolatile semiconductor memory chip that is physically separated from the first nonvolatile semiconductor memory chip.

10. The storage device of claim 9, wherein the first and second nonvolatile semiconductor memory chips are incorporated in different packages.

11. The storage device of claim 8, wherein the controller circuit sets the operation mode of the first nonvolatile semiconductor memory chip into the first mode, the first nonvolatile semiconductor memory chip which outputs the first data to the controller circuit is in the first mode, the controller circuit determines whether or not an error in the first data is correctable, the controller circuit sets the operation mode of the first nonvolatile semiconductor memory chip into the second mode if the controller circuit determines that the error in the first data is uncorrectable, and the controller circuit sends to the first nonvolatile semiconductor memory chip in the second mode a second request for reading from the first address.

12. The storage device of claim 8, wherein the first request includes a first command, the first address, and a second command.

13. The storage device of claim 12, wherein the first command is 00h, and the second command is 30h.

14. The storage device of claim 8, wherein the first nonvolatile semiconductor memory chip is a NAND flash memory.

* * * * *